US008536043B2

(12) United States Patent
Kim et al.

(10) Patent No.: US 8,536,043 B2
(45) Date of Patent: Sep. 17, 2013

(54) REDUCED S/D CONTACT RESISTANCE OF III-V MOSFET USING LOW TEMPERATURE METAL-INDUCED CRYSTALLIZATION OF N+ GE

(75) Inventors: Jeehwan Kim, Los Angeles, CA (US); Jin-Hong Park, Gyeonggi-do (KR); Devendra Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 13/017,127

(22) Filed: Jan. 31, 2011

(65) Prior Publication Data
US 2012/0193687 A1     Aug. 2, 2012

(51) Int. Cl.
*H01L 21/28*     (2006.01)

(52) U.S. Cl.
USPC ............. 438/604; 257/E21.158; 257/E29.242

(58) Field of Classification Search
USPC .................... 438/604; 257/E21.158, E29.242
See application file for complete search history.

(56) References Cited

U.S. PATENT DOCUMENTS

| 2004/0110329 A1* | 6/2004 | Joo et al. ....................... 438/166 |
| 2010/0140711 A1* | 6/2010 | Ishitsuka et al. ............... 257/351 |
| 2012/0190150 A1* | 7/2012 | Levine et al. .................... 438/72 |

OTHER PUBLICATIONS

Jin-Hong Park et al., "Low Temperature (≦380° C) and High Performance Ge COMS Technology with Novel Source/Drain by Metal-Induced Dopants Activation and High-K/Metal Gate Stack for Monolithic 3D Integration", IEEE International Electron Devices Meeting (EIDM) 2008 Technical Digest, pp. 389-392, San Francisco, CA, Dec. 15-17, 2008.

Jin-Hong Park et al., "High Performance Germanium N+/P and P+/N Junction Diodes Formed at Low Temperature (≦380° C) Using Metal-Induced Dopant Activation", Applied Physics Letters 93, 193507 (2008).

Jin-Hong Park et al., "Metal-Induced Dopant (Boron and Phosphorus) Activation Process in Amorphous Germanium for Monolithic Three-Dimensional Integration", Journal of Applied Physics 106, 074510 (2009).

Shu Hu et al. "Interface-Controlled Layer Exchange in Metal-Induced Crystallization of Germanium Thin Films", Applied Physics Letters 97, 082104 (2010).

Tomonori Nishimura et al. "Low Temperature Phosphorus Activation in Germanium Through Nickel Germanidation for Shallow n+/p Junction", Applied Physics Express 2 (2009) 021202.

* cited by examiner

*Primary Examiner* — Matthew Landau
*Assistant Examiner* — Colleen E Snow
(74) *Attorney, Agent, or Firm* — Harrington & Smith; Louis J. Percello

(57) ABSTRACT

Embodiments of this invention provide a method to fabricate an electrical contact. The method includes providing a substrate of a compound Group III-V semiconductor material having at least one electrically conducting doped region adjacent to a surface of the substrate. The method further includes fabricating the electrical contact to the at least one electrically conducting doped region by depositing a single crystal layer of germanium over the surface of the substrate so as to at least partially overlie the at least one electrically conducting doped region, converting the single crystal layer of germanium into a layer of amorphous germanium by implanting a dopant, forming a metal layer over exposed surfaces of the amorphous germanium layer, and performing a metal-induced crystallization (MIC) process on the amorphous germanium layer having the overlying metal layer to convert the amorphous germanium layer to a crystalline germanium layer and to activate the implanted dopant. The electrical contact can be a source or a drain contact of a transistor.

21 Claims, 6 Drawing Sheets

REDUCED S/D CONTACT RESISTANCE OF III-V MOSFET USING LOW TEMPERATURE METAL-INDUCED CRYSTALLIZATION OF N+ GE

TECHNICAL FIELD

The exemplary embodiments of this invention relate generally to semiconductor devices and to procedures to fabricate semiconductor devices and, more specifically, relate to transistors, such as MOSFETs, comprised of Group III-V semiconductor material having amorphous Germanium contacts.

BACKGROUND

The use of metal-induced dopant activation (MIDA) in amorphous Germanium ($\alpha$-Ge) (Germanium is a Group IV element) is a known process. For example, reference can be made to Jin-Hong Park, M. Tada, D. Kuzum, P. Kapur, H-.Y. Yu, H-.S. Philip Wong, and K. C. Saraswat, "Low Temperature ($\leq 380°$ C.) and High Performance Ge CMOS Technology with Novel Source/Drain by Metal-Induced Dopants Activation and High-K/Metal Gate Stack for Monolithic 3D Integration," IEEE International Electron Devices Meeting (IEDM) 2008 Technical Digest, pp. 389-392, San Francisco, Calif., Dec. 15-17, 2008; and Jin-Hong Park, D. Kuzum, M. Tada and K. C. Saraswat, "High Performance Germanium N$^+$/P and P$^{30}$/N junction diodes formed at Low Temperature (<380° C.) using Metal-Induced Dopant Activation", Applied Physics Letters 93, 193507 (2008). Reference can also be made to Jin-Hong Park, M. Tada, Woo-Shik Jung, H-.S. Philip Wong, and K. C. Saraswat, "Metal-induced dopant (boron and phosphorus) activation process in amorphous germanium for monolithic three-dimensional integration", Journal of Applied Physics 106, 074510 (2009).

FIG. 1 herein reproduces FIG. 3(b) from the Park et al. Applied Physics Letters 93 publication and shows SIMS (secondary ion mass spectrometer) and SRP (spreading resistance profiling) data (carrier concentration as a function of depth) of an N$^+$/P junction on epi-Ge annealed at 360° C. for 10 minutes with Co and at 600° C. for 1 minute without Co. The Figure illustrates the distinction between P implantation and Co-induced crystallization.

A problem that arises when considering the fabrication of transistors using a Group III-V compound semiconductor (composed of elements from Group III and Group V of the periodic table of elements) is that due at least to a reliable silicide process, the self-aligned integration of a Group III-V transistor (e.g., a metal oxide semiconductor field effect transistor or MOSFET) is difficult to accomplish. This difficulty can affect the ability to fabricate low resistance electrical contacts to the source and drain regions of the transistor.

SUMMARY

The foregoing and other problems are overcome, and other advantages are realized, in accordance with the exemplary embodiments of this invention.

In one aspect thereof the embodiments of this invention provide a method to fabricate an electrical contact, comprising providing a substrate comprised of a compound Group III-V semiconductor material having at least one electrically conducting doped region adjacent to a surface of the substrate; and fabricating the electrical contact to the at least one electrically conducting doped region by depositing a single crystal layer of germanium over the surface of the substrate so as to at least partially overlie the at least one electrically conducting doped region, converting the single crystal layer of germanium into a layer of amorphous germanium by implanting a dopant, forming a metal layer over exposed surfaces of the amorphous germanium layer, and performing a metal-induced crystallization (MIC) process on the amorphous germanium layer having the overlying metal layer to convert the amorphous germanium layer to a crystalline germanium layer and to activate the implanted dopant.

In another aspect thereof the embodiments of this invention provide a method to fabricate a semiconductor device, comprising providing a Group III-V substrate having a source region and a drain region that are spaced apart adjacent to a surface of the substrate and that define a channel there between, and disposed over the channel a gate stack structure contained within a dielectric material; and fabricating a source contact and a drain contact by selectively depositing a single crystal layer of germanium over the surface of the substrate so as to overlie the source region and the drain region but not the dielectric material, implanting the crystalline layer of germanium with a dopant and converting the crystalline layer of germanium to a doped amorphous germanium layer, forming an overlying metal layer over exposed surfaces of the doped amorphous germanium layer, applying heat to convert the amorphous germanium layer having the overlying metal layer to a crystalline germanium layer and to activate the implanted dopant, and removing the overlying metal layer and the underlying dielectric material from the gate stack structure so as leave a source spacer between the crystalline germanium layer that overlies the source region and a drain spacer between the crystalline germanium layer that overlies the drain region.

In a further aspect thereof the embodiments of this invention provide a transistor that comprises a compound Group III-V substrate having a source region and a drain region that are spaced apart adjacent to a surface of the substrate and that define a channel there between; a gate stack structure disposed over the channel; electrically insulating source and drain spacers disposed at least partially over the source and drain regions, respectively, and abutting the gate stack structure; and a source contact and a drain contact at least partially overlying the source region and the drain region, respectively, and separated from the gate stack structure by the source and drain spacers, respectively, said source and drain contacts each comprised of a layer of crystalline doped germanium having an overlying layer of metal.

DETAILED DESCRIPTION

Figure 1:
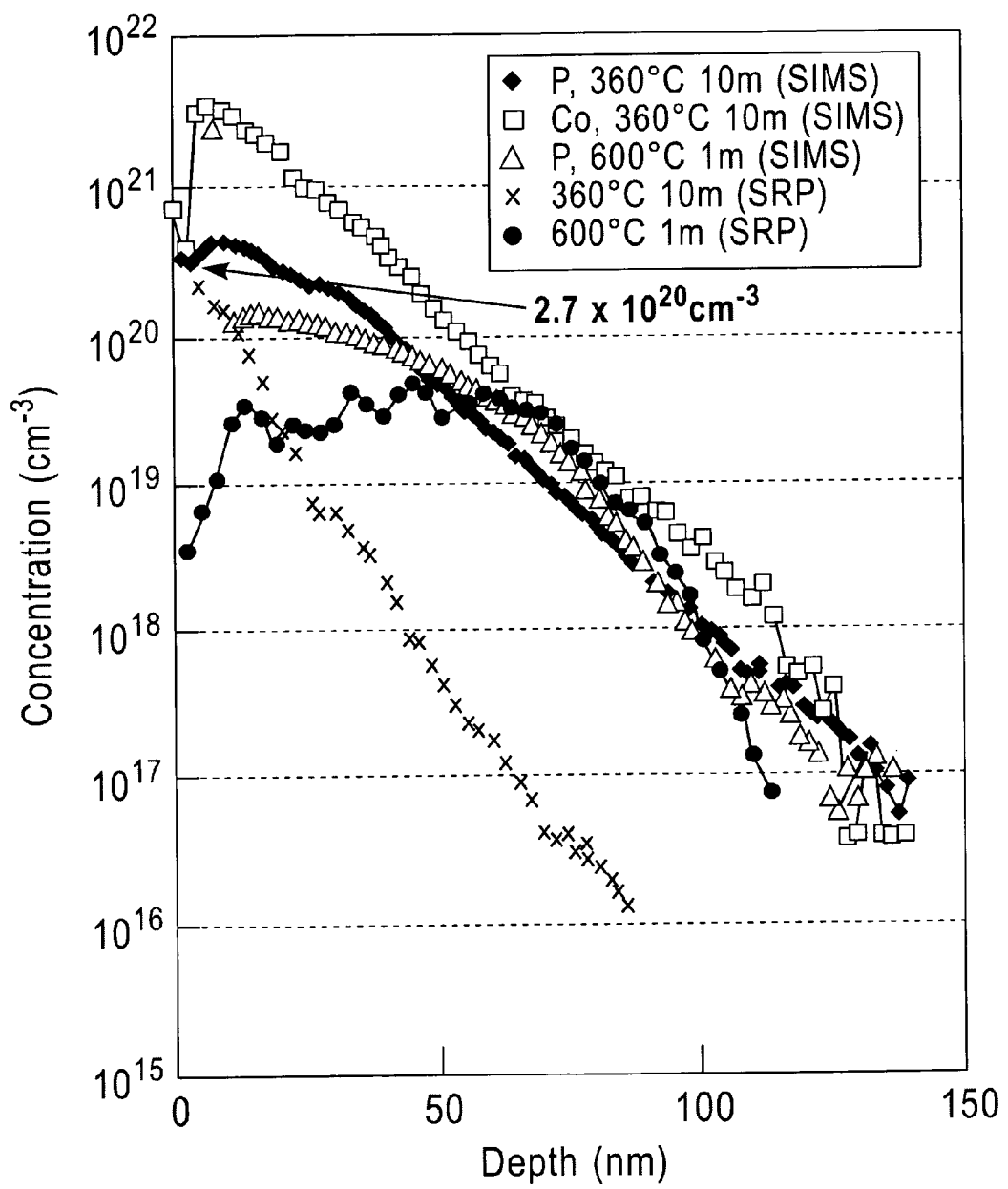
FIG. 1 is a graph showing shows SIMS (secondary ion mass spectrometer) and SRP (spreading resistance profiling) data (carrier concentration as a function of depth) of an N$^+$/P junction on epi-Ge annealed at 360° C. for 10 minutes with Co and at 600° C. for 1 minute without Co.
Figure 2A:
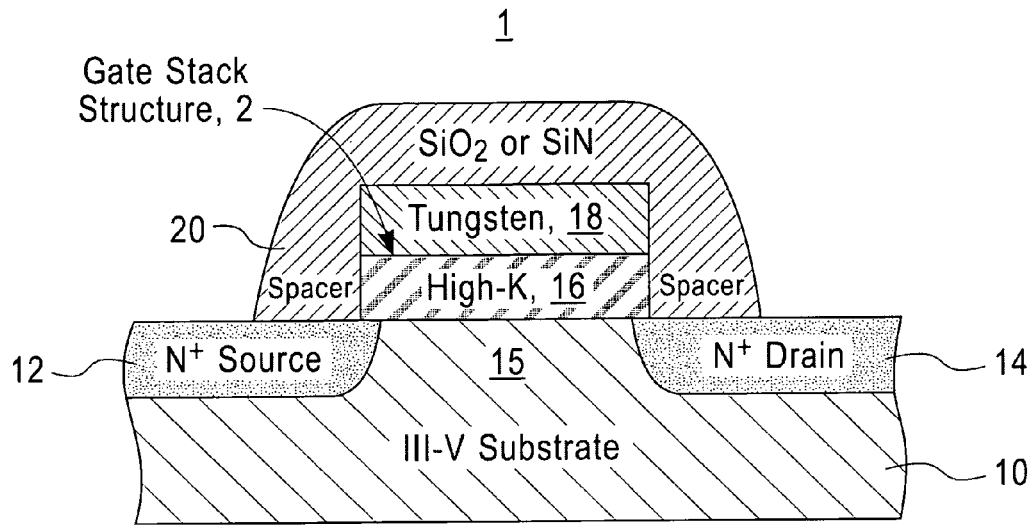
FIGS. 2A-2E, collectively referred to as FIG. 2, illustrate enlarged cross-sectional views of a Group III-V MOSFET at different fabrication points in accordance with the embodiments of this invention.

FIG. 2A depicts a starting structure 1 for a Group III-V electronic device, such as a MOSFET. The starting structure 1 has been pre-fabricated using a Group III-V substrate 10. The Group III-V substrate 10 can be a binary Group III-V material, such as GaAs or a tertiary Group III-V material such as GaAlAs, or a quarternary Group III-V material such as a GaAlAsP, as non-limiting examples. The Group III-V material substrate 10 has formed therein an N+ source 12 region and an N+ drain 14 region. The N+ source 12 region and the N+ drain 14 region may be formed by ion implanting a suitable N+ species such as Si. A channel, also referred to herein as a gate region 15, will exist between the N+ source 12 region and the N+ drain 14 region (the channel exists in the Group III-V material). The gate region 15 may have a length of, by example, 30 nanometers or less. Over the gate region 15 is formed a gate stack structure 2 that includes an electrically insulating high dielectric layer (high-k) layer 16. The high-k layer 16 may be a layer of, by example, hafnium dioxide (HfO$_2$), zirconium dioxide (ZrO$_2$), or titanium dioxide (TiO$_2$), all of which inherently have a dielectric constant or "k" above 3.9, the dielectric constant of Silicon Dioxide (SiO$_2$). The high-k layer 16 may have a thickness in the range of about 1 nanometer to about 5 nanometers, with 3 nanometers being a typical useful value. The gate stack structure 2 further includes a layer of gate metallization 18, such as a layer of Tungsten, or Titanium Nitride (TiN), or Tantalum Nitride (TaN), or polysilicon, as several non-limiting examples. The gate metallization layer 18 can have a thickness of, for example, about 30 nanometers. Overlying the gate stack structure 2 is a dielectric layer forming an electrically insulating layer 20 of, for example, Silicon Dioxide (SiO$_2$) or Silicon Nitride (SiN). Those portions of the insulating layer 20 that are disposed along the sides of the gate stack structure 2 will subsequently function as gate spacers.

Figure 2B:
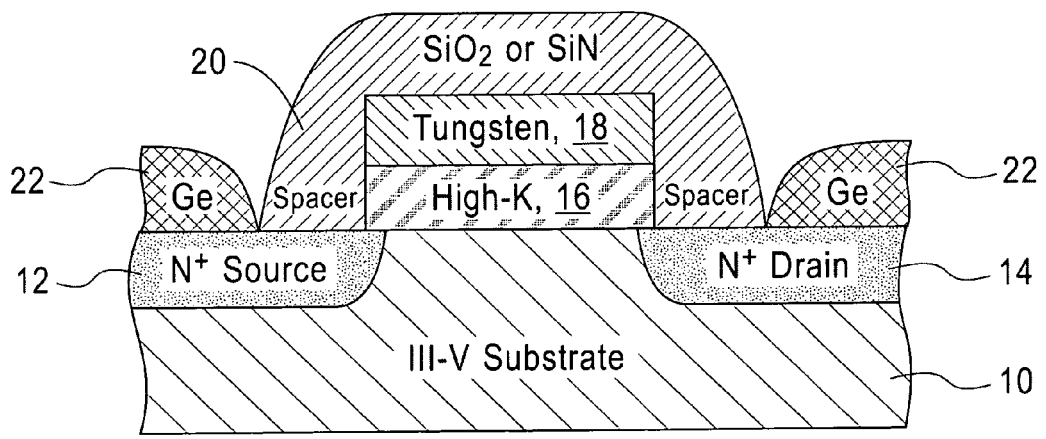

FIG. 2B illustrates a first intermediate transistor structure based on the starting structure 1. In FIG. 2B it can be seen that a layer 22 of Ge is grown over the N+ source 12 region and the N+ drain 14 region, i.e., on the Group III-V substrate. The Ge layer 22 can be grown at a temperature that exceeds about 450° C. and as formed is substantially a single crystal material and can have a thickness of, for example, about 50 nanometers. The Ge layer 22 can be formed by any suitable growth process such as metal-organic chemical vapor deposition (MOCVD) or high vacuum chemical vapor deposition (CVD). Due to the propensity of Ge to preferentially nucleate and grow only on the Group III-V substrate material, and not on the SiO$_2$ or SiN insulator layer 20, a masking operation is not required. In effect, the growth of the GE layer 22 may be viewed as a self-aligned growth process.

This aspect of the invention thus selectively grows Ge on a III-V substrate patterned with, for example, SiO$_x$, SiN$_x$ or Al$_2$O$_3$. While it is possible that there may be some minor nucleation of Ge on the dielectric surface as well this can be inhibited by, for example, increasing the growth temperature or by introducing HCl gas during the Ge growth in CVD.

Figure 2C:
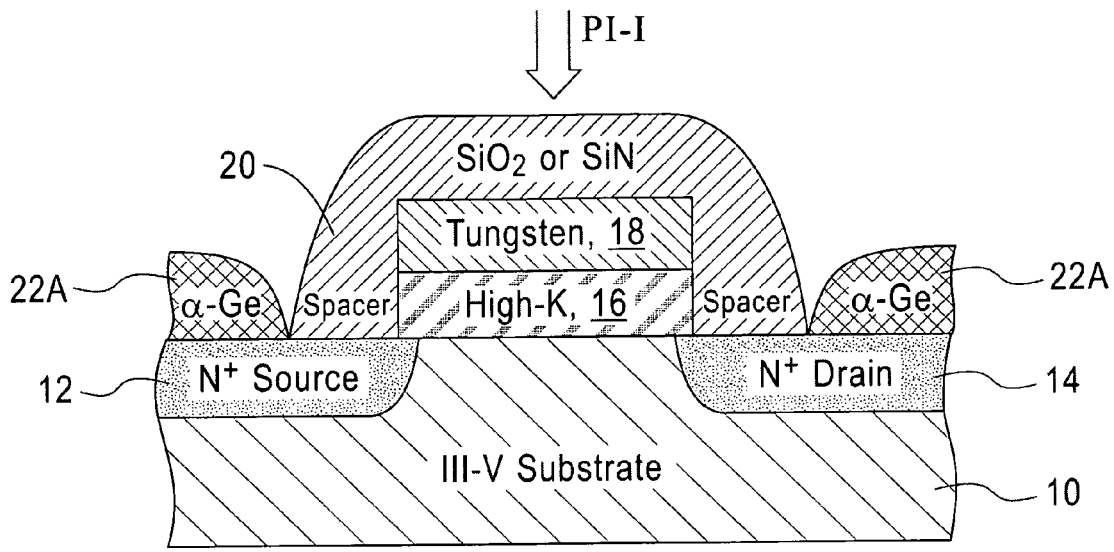

FIG. 2C illustrates a second intermediate transistor structure based on the first intermediate transistor structure of FIG. 2B. FIG. 2C shows the performance of a Phosphorous ion implant (P I/I). The dosage can be about $10^{15}$ cm$^2$ that is applied at an energy of about 10 key (or less). The P I/I converts the single crystal Ge layer 22 to an amorphous Ge (α-Ge) layer 22A.

Figure 2D:
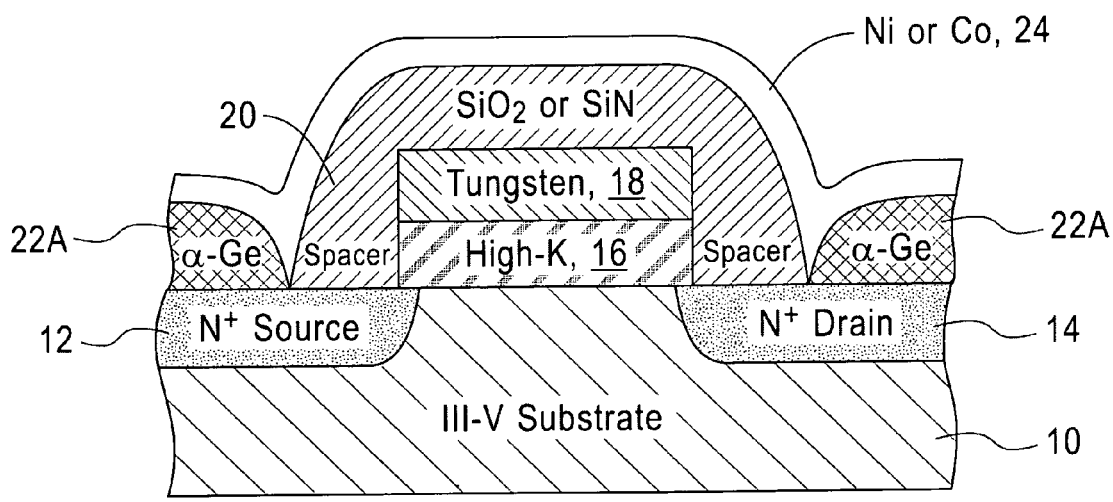

FIG. 2D illustrates a third intermediate transistor structure based on the second intermediate transistor structure of FIG. 2C. FIG. 2D shows the blanket deposition of a metal layer 24 containing, for example, Nickel or Cobalt. The metal layer 24 may have a thickness of about 10 nanometers, and can be formed using any suitable metal deposition process such as e-beam deposition or sputtering.

Figure 2E:
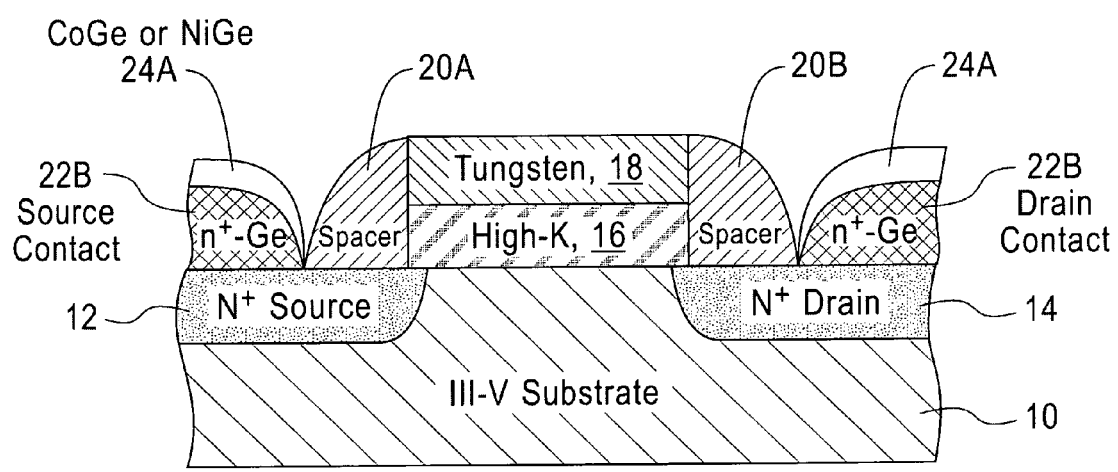

FIG. 2E illustrates a final transistor structure (although other additional conventional processing could still be performed) that is based on the third intermediate transistor structure of FIG. 2D. To arrive at the final transistor structure shown in FIG. 2E a metal-induced crystallization (MIC) process is performed to drive in and activate the P dopant implanted in FIG. 2C, thereby converting the α-Ge layer 22A to a crystallized (a polycrystalline) n+ Ge layer 22B. The MIC process is preferably a relatively low temperature process that is carried out at a temperature of about 400° C. or less (e.g., in a range of about 150° C. to about 380° C. for a period of about 1 hour to about 4 hours). A wet etch process (e.g., one using HCl) can be used then to remove that portion of the metallization layer 24 that overlies the SiO$_2$ or SiN insulator disposed over the top of the gate structure 2, followed by the removal of the underlying SiO$_2$ or SiN insulator material, thereby exposing the Tungsten layer 18 that forms the gate contact. The underlying SiO$_2$ or SiN insulator material can be removed using, for example, any suitable etching process. The resulting final transistor structure is thus characterized by high conductivity (e.g., in range of about 1e-6 ohm-cm to about 1 ohm-cm) n+ crystalline Ge S/D contacts having an overlayer 24A of, e.g., NiGe or CoGe, where the S/D contacts are insulated from the gate stack materials by the intervening SiO$_2$ or SiN spacers 20A, 20B that abut side walls of the gate stack structure 2. The metal-induced dopant activation (MIDA) process beneficially provides the crystallized n+ Ge layer 22B, and what may be viewed as a NiGe or CoGe silicide process, and which thus forms the basis of the formation of the low temperature budget (lower annealing temperature) and low resistivity S/D contacts The dopant concentration in the n+ Ge S/D contacts 22B may be about $5 \times 10^{19}$ atoms/cm$^3$ or greater.

It should be realized that the embodiments of this invention may be implemented by using materials other than those expressly mentioned above, and/or by using different material thicknesses, and/or by using different temperatures and times, and/or by using different dopant concentrations and ion implant species (e.g., Boron) and implant parameters. For example, in other embodiments a metal such as Al may be used instead of Ni or Co, with corresponding adjustments made to MIC temperatures and times so as to achieve the desired crystalline grain size and dopant activation. Reference in this regard can be made to, for example, Shu Hu, Ann F. Marshall, and Paul C. McIntyre, "Interface-controlled layer exchange in metal-induced crystallization of germanium thin films", Applied Physics Letters 97, 082104 (2010). These authors report metal (Al)-induced crystallization to form poly-Ge thin films on glass and polymer substrates. To avoid a disordered mixture of Al and crystalline Ge the α-Ge surface is intentionally oxidized by flowing ozone gas at room temperature to form a very thin GeO$_x$ layer prior to Al deposition, followed by an anneal of the bilayers in vacuum at 250° C. for one hour. The same or a similar procedure can be used during fabrication of the final transistor structure shown in FIG. 2E.

Further by example, in other embodiments a transistor having p+ source and drain regions 12 and 14 may be formed, and in still other embodiments the electronic device that is fabricated to have improved contacts may be other than a transistor (e.g., a light-emitting or a photodiode or a solar cell).

Figure 3:
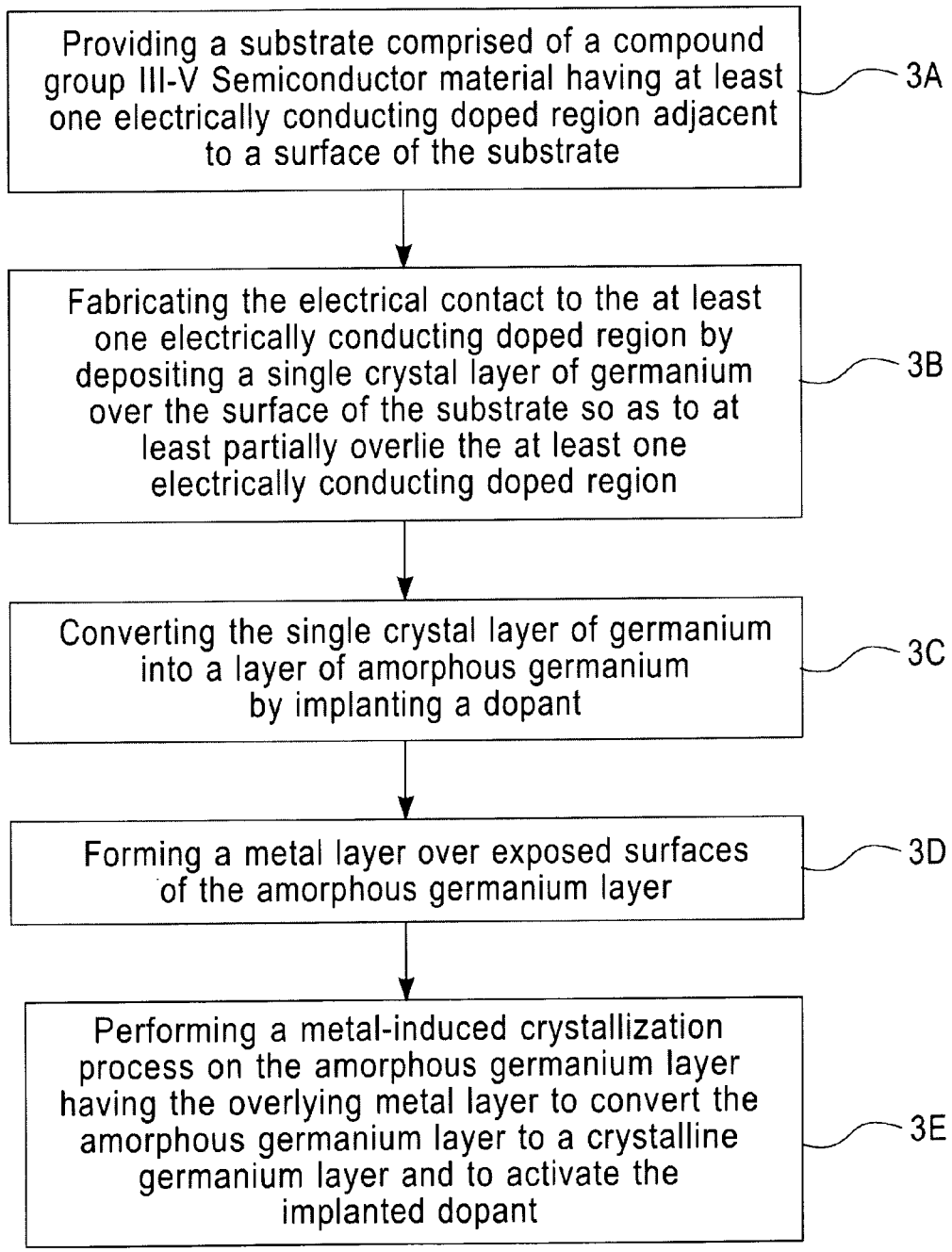
FIGS. 3 and 4 are each a process flow diagram in accordance with the exemplary embodiments of this invention.

FIG. 3 is a process flow diagram in accordance with the exemplary embodiments of this invention. More specifically, FIG. 3 shows a process to fabricate an electrical contact. In Block 3A there is a step of providing a substrate comprised of a compound Group III-V semiconductor material having at least one electrically conducting doped region adjacent to a surface of the substrate. In Block 3B there is a step of fabricating the electrical contact to the at least one electrically conducting doped region by depositing a single crystal layer of germanium over the surface of the substrate so as to at least partially overlie the at least one electrically conducting doped region. In Block 3C the electrical contact is further fabricated by converting the single crystal layer of germanium into a layer of amorphous germanium by implanting a dopant. In Block 3D the electrical contact is further fabricated by forming a metal layer over exposed surfaces of the amorphous germanium layer. In Block 3E the electrical contact is further fabricated by performing a metal-induced crystallization process on the amorphous germanium layer having the overlying metal layer to convert the amorphous germanium layer to a crystalline germanium layer and to activate the implanted dopant.

Figure 4:
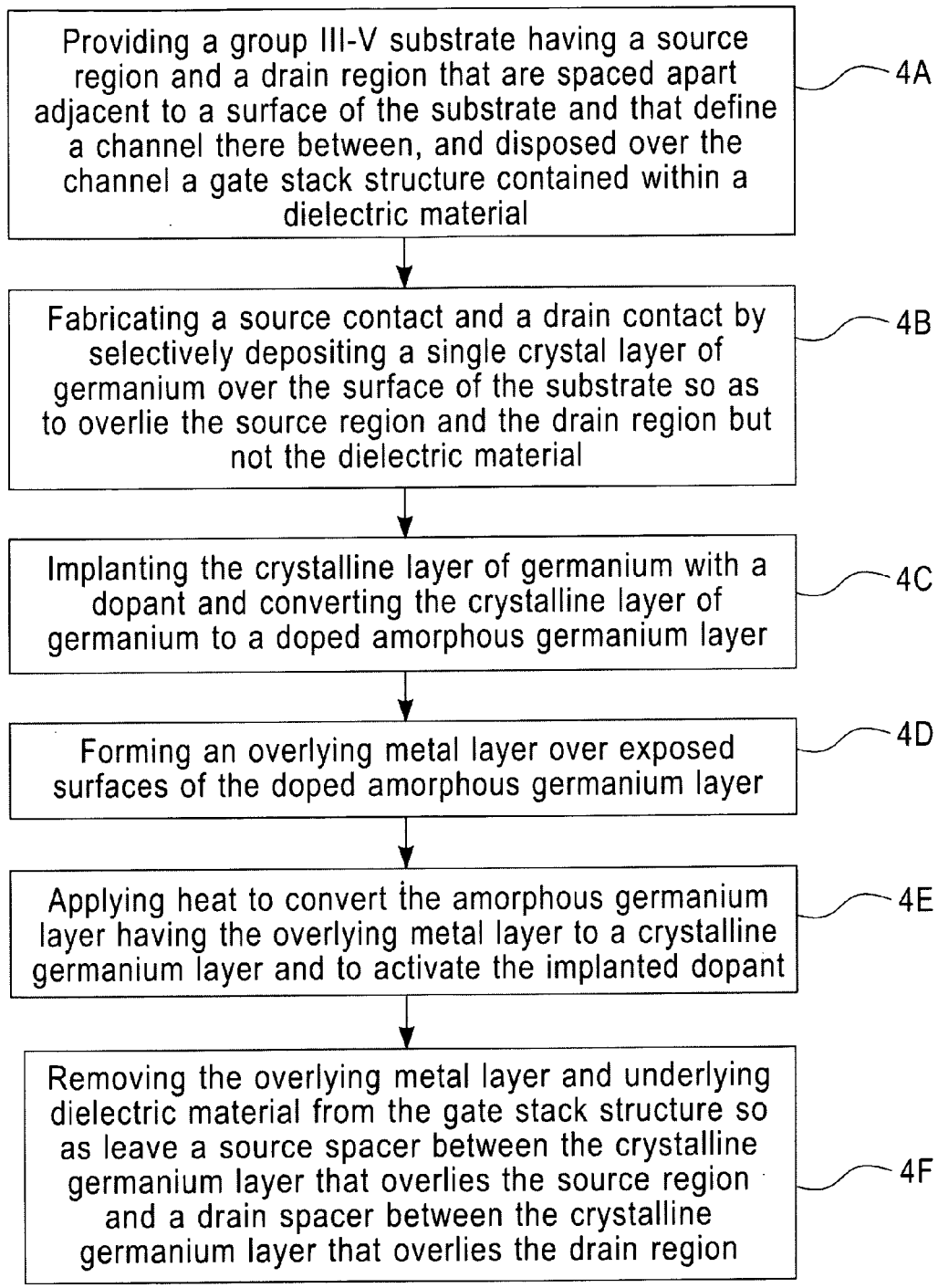

FIG. 4 is a process flow diagram further in accordance with the exemplary embodiments of this invention. More specifically, FIG. 4 shows a process to fabricate a semiconductor device. In Block 4A there is a step of providing a Group III-V substrate having a source region and a drain region that are spaced apart adjacent to a surface of the substrate and that define a channel there between, and disposed over the channel a gate stack structure contained within a dielectric material, In Block 4B there is a step of fabricating a source contact and a drain contact by selectively depositing a single crystal layer of germanium over the surface of the substrate so as to overlie the source region and the drain region but not the dielectric material. In Block 4C the source contact and the drain contact are further fabricated by implanting the crystalline layer of germanium with a dopant and converting the crystalline layer of germanium to a doped amorphous germanium layer. In Block 4D the source contact and the drain contact are further fabricated by forming an overlying metal layer over exposed surfaces of the doped amorphous germanium layer. In Block 4E the source contact and the drain contact are further fabricated by applying heat to convert the amorphous germanium layer having the overlying metal layer to a crystalline germanium layer and to activate the implanted dopant. In Block 4F the source contact and the drain contact are further fabricated by removing the overlying metal layer, such as Ni or Co or Al, and the underlying dielectric material from the gate stack structure so as leave a source spacer between the crystalline germanium layer that overlies the source region and a drain spacer between the crystalline germanium layer that overlies the drain region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but a few some examples, and as was indicated previously, the use of other similar or equivalent semiconductor materials, dopants, etchants, process chambers and the like may be used by those skilled in the art. However, all such and similar modifications of the teachings of this invention will still fall within the scope of this invention.

What is claimed is:

1. A method to fabricate an electrical contact, comprising:
providing a substrate comprised of a compound Group III-V semiconductor material having at least one electrically conducting doped region adjacent to a surface of the substrate; and
fabricating the electrical contact to the at least one electrically conducting doped region by
depositing a single crystal layer of germanium over the surface of the substrate so as to at least partially overlie the at least one electrically conducting doped region,
converting the single crystal layer of germanium into a layer of amorphous germanium by implanting a dopant,
forming a metal layer over exposed surfaces of the amorphous germanium layer, and
performing a metal-induced crystallization process on the amorphous germanium layer having the overlying metal layer to convert the amorphous germanium layer to a crystalline germanium layer and to activate the implanted dopant.

2. The method of claim 1, where the dopant is comprised of phosphorous or boron.

3. The method of claim 1, where the metal layer is comprised of nickel or cobalt or aluminum.

4. The method of claim 1, where the metal-induced crystallization process occurs at a temperature of about 400° C. or less.

5. A method to fabricate a semiconductor device, comprising:
providing a Group III-V substrate having a source region and a drain region that are spaced apart adjacent to a surface of the substrate and that define a channel there between, and disposed over the channel a gate stack structure contained within a dielectric material; and
fabricating a source contact and a drain contact by selectively depositing a single crystal layer of germanium over the surface of the substrate so as to overlie the source region and the drain region but not the dielectric material, implanting the crystalline layer of germanium with a dopant and converting the crystalline layer of germanium to a doped amorphous germanium layer, forming an overlying metal layer over exposed surfaces of the doped amorphous germanium layer, applying heat to convert the amorphous germanium layer having the overlying metal layer to a crystalline germanium layer and to activate the implanted dopant, and removing the overlying metal layer and the underlying dielectric material from the gate stack structure so as leave a source spacer between the crystalline germanium layer that overlies the source region and a drain spacer between the crystalline germanium layer that overlies the drain region.

6. The method of claim 5, where the dielectric material is comprised of one of silicon dioxide or silicon nitride, and where selectively depositing blanket deposits germanium so as to preferentially nucleate only on the Group III-V substrate and not the dielectric layer.

7. The method of claim 5, where the dopant is comprised of phosphorous.

8. The method of claim 5, where the dopant is comprised of boron.

9. The method of claim 5, where the metal layer is comprised of nickel.

10. The method of claim 5, where the metal layer is comprised of cobalt.

11. The method of claim 5, where the metal layer is comprised of aluminum.

12. The method of claim 5, where applying heat applies heat sufficient to perform metal induced crystallization (MIC) of the amorphous germanium layer.

13. The method of claim 12, where applying heat occurs at a temperature of about 400° C. or less 14. The method of claim 5, where the metal layer is formed by a blanket deposition process so as to cover the exposed surfaces of the doped amorphous germanium layer and the dielectric material that contains the gate stack structure, and where removing the metal layer from the gate stack structure comprises removing only a portion of the layer of metal that covers the dielectric material and not a portion of the layer of deposited metal that covers the doped amorphous germanium layer.

15. The method of claim 14, where the gate stack structure is comprised of a layer of high dielectric constant material and a layer of gate metallization overlying the layer of high dielectric constant material and where removing the metal layer and the underlying dielectric material from the gate stack structure comprises exposing the layer of gate metallization.

16. A method to fabricate a semiconductor device, comprising:
providing a Group III-V substrate having a source region and a drain region that are spaced apart adjacent to a surface of the substrate and contained within the Group III-V substrate, the source region and the drain region defining a channel there between and disposed over the channel a gate stack structure contained within a dielectric material; and
fabricating a source contact and a drain contact by selectively depositing a single crystal layer of germanium over the surface of the substrate so as to overlie the source region and the drain region but not the dielectric material, implanting the crystalline layer of germanium with a dopant and converting the crystalline layer of germanium to a doped amorphous germanium layer, forming an overlying metal layer over exposed surfaces of the doped amorphous germanium layer, applying heat to convert the amorphous germanium layer having the overlying metal layer to a crystalline germanium layer and to activate the implanted dopant, where the heat is sufficient to perform metal induced crystallization (MIC) of the amorphous germanium layer; and removing the overlying metal layer and the underlying dielectric material from the gate stack structure so as leave a source spacer between the crystalline germanium layer that overlies the source region and a drain spacer between the crystalline germanium layer that overlies the drain region.

17. The method of claim 16, where the dielectric material is comprised of one of silicon dioxide or silicon nitride, and where selectively depositing blanket deposits germanium so as to preferentially nucleate only on the Group III-V substrate and not the dielectric layer.

18. The method of claim 16, where the dopant is comprised of one of phosphorous or boron, and where the metal layer is comprised of one of nickel, cobalt or aluminum.

19. The method of claim 16, where applying heat occurs at a temperature of about 400° C. or less.

20. The method of claim 16, where the metal layer is formed by a blanket deposition process so as to cover the exposed surfaces of the doped amorphous germanium layer and the dielectric material that contains the gate stack structure, and where removing the metal layer from the gate stack structure comprises removing only a portion of the layer of metal that covers the dielectric material and not a portion of the layer of deposited metal that covers the doped amorphous germanium layer.

21. The method of claim 20, where the gate stack structure is comprised of a layer of high dielectric constant material and a layer of gate metallization overlying the layer of high dielectric constant material and where removing the metal layer and the underlying dielectric material from the gate stack structure comprises exposing the layer of gate metallization.

* * * * *